(12) United States Patent
Marques et al.

(10) Patent No.: US 9,479,153 B2
(45) Date of Patent: Oct. 25, 2016

(54) LARGE PROJECTED CAPACITIVE TOUCH SENSOR

(71) Applicant: DISPLAX S.A., Braga (PT)

(72) Inventors: Pedro Luis Fernandes Marques, Longos-Guimarães (PT); Miguel Angelo Magalhaes Fonseca, Braga (PT); Joao Paulo Pinto da Rocha Barbosa, Braga (PT); Antonio Augusto Babo de Carvalho, Vila Mea (PT); José Miguel Fernandes Peixoto de Oliveira, Santo Tirso (PT)

(73) Assignee: Displax S.A., Braga (PT)

( * ) Notice: Subject to any disclaimer, the term of this patent is extended or adjusted under 35 U.S.C. 154(b) by 14 days.

(21) Appl. No.: 14/295,948

(22) Filed: Jun. 4, 2014

(65) Prior Publication Data

US 2015/0358014 A1 Dec. 10, 2015

(51) Int. Cl.
*G06F 17/50* (2006.01)
*H03K 17/16* (2006.01)
*H03K 17/96* (2006.01)
*G06F 3/044* (2006.01)
*G06F 3/0488* (2013.01)

(52) U.S. Cl.
CPC ............. *H03K 17/16* (2013.01); *G06F 3/044* (2013.01); *G06F 17/5072* (2013.01); *H03K 17/9622* (2013.01); *H03K 2017/9602* (2013.01); *Y10T 29/49107* (2015.01)

(58) Field of Classification Search
CPC .. G06F 3/0488; G06F 3/04886; G06F 17/50; G06F 17/5045; G06F 17/5068

USPC ..................................... 703/1; 345/173, 174
See application file for complete search history.

(56) References Cited

U.S. PATENT DOCUMENTS

| | | | |
|---|---|---|---|
| 8,599,161 B2 | 12/2013 | Philipp | |
| 2008/0150906 A1* | 6/2008 | Grivna | G06F 3/0416 345/173 |
| 2011/0291966 A1 | 12/2011 | Takao et al. | |
| 2011/0310037 A1 | 12/2011 | Moran et al. | |
| 2013/0017321 A1 | 1/2013 | Kim et al. | |
| 2013/0032414 A1 | 2/2013 | Yilmaz et al. | |
| 2013/0044384 A1 | 2/2013 | Kim et al. | |

(Continued)

FOREIGN PATENT DOCUMENTS

| KR | 2011127101 A | 11/2011 |
|---|---|---|
| WO | WO0127868 A9 | 10/2002 |

(Continued)

OTHER PUBLICATIONS

European Search Report issued in European Application No. 15398006.5 on Sep. 30, 2015, 4 pages.

*Primary Examiner* — Omar Fernandez Rivas
*Assistant Examiner* — Shiuh-Huei Ku
(74) *Attorney, Agent, or Firm* — Fish & Richardson P.C.

(57) ABSTRACT

The present disclosure describes methods for designing a projected capacitive touch sensor, projected capacitive touch sensor manufacturing methods, and projected capacitive touch sensors. A projected capacitive touch sensor may comprise: a sensor grid including electrically conductive rows and electrically conductive columns, and wherein one or more rows, or one or more columns, include one or more electrically conductive tiles, wherein each tile includes multiple electrically connected elements with pseudo-random orientation.

22 Claims, 12 Drawing Sheets

(56) References Cited

U.S. PATENT DOCUMENTS

| | | |
|---|---|---|
| 2013/0113502 A1 | 5/2013 | Yilmaz et al. |
| 2013/0127772 A1 | 5/2013 | Guard et al. |
| 2013/0207911 A1 | 8/2013 | Barton et al. |
| 2014/0041924 A1 | 2/2014 | Cok |
| 2014/0055380 A1* | 2/2014 | Han ................. G06F 3/041 345/173 |
| 2014/0055403 A1 | 2/2014 | Cok |
| 2014/0210784 A1* | 7/2014 | Gourevitch .......... H03K 17/962 345/174 |

FOREIGN PATENT DOCUMENTS

| | | |
|---|---|---|
| WO | 2014001405 | 1/2014 |
| WO | 2014021168 | 2/2014 |

* cited by examiner

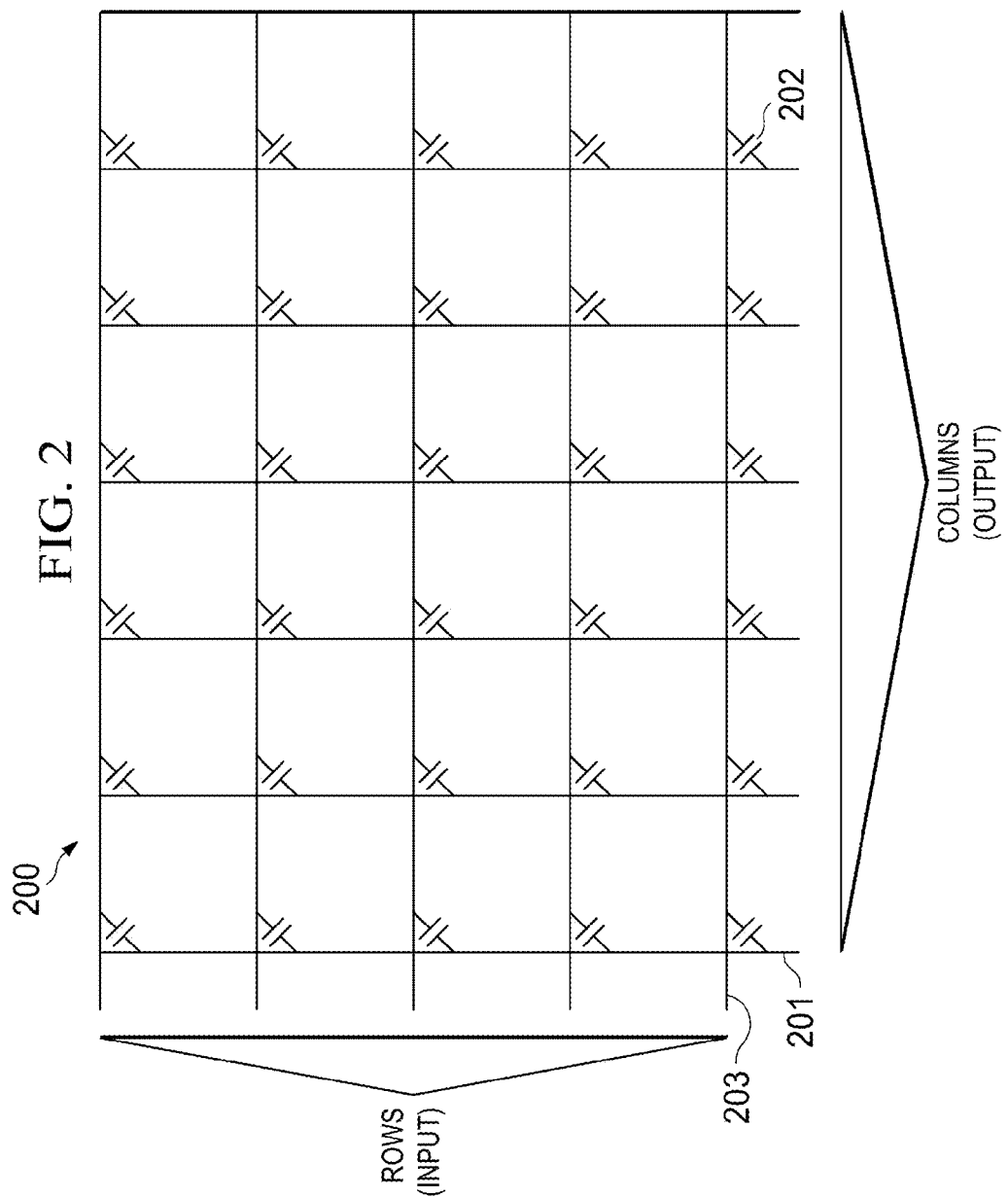

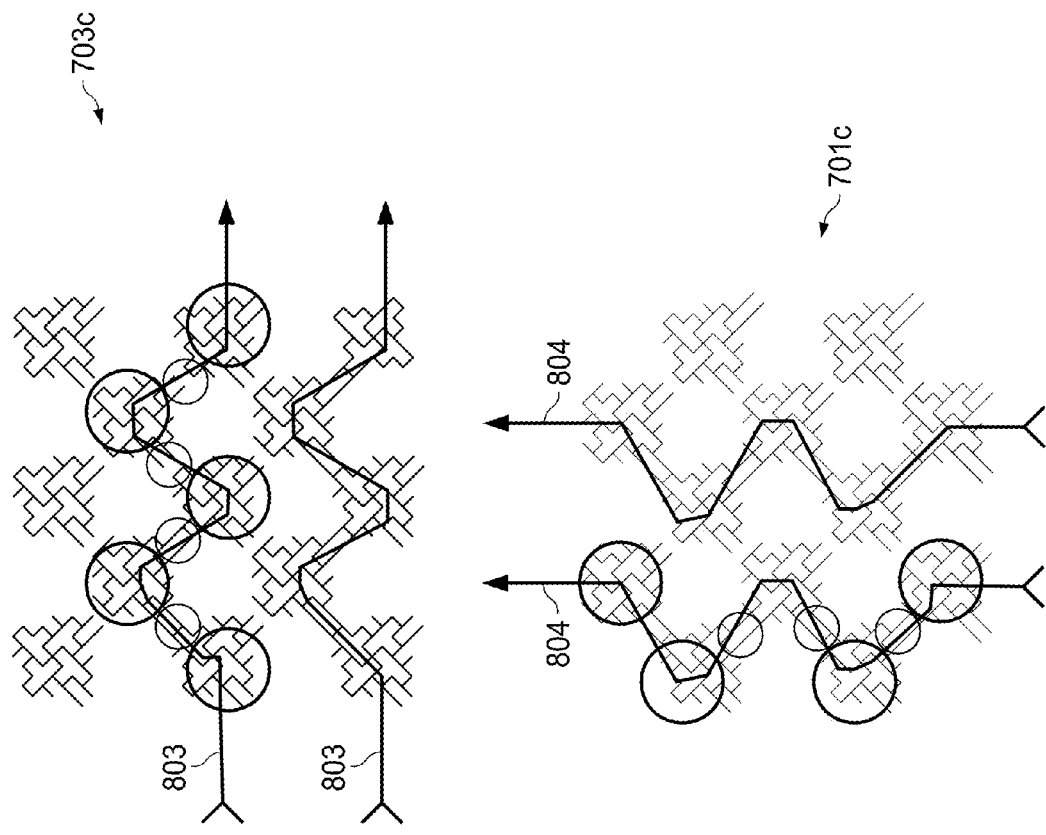
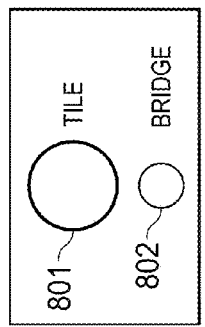
FIG. 8A
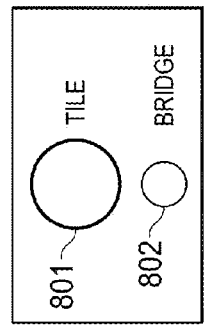
FIG. 8B

LARGE PROJECTED CAPACITIVE TOUCH SENSOR

TECHNICAL FIELD

The present disclosure relates to a projected capacitive touch sensor of large sizes, e.g. with a diagonal above 32 inches, preferably up to 150 inches. Specifically, a projected capacitive touch sensor is provided with reduced Moiré effect and/or reduced electrical losses.

BACKGROUND

Touch-sensitive displays are widely employed for an expanding variety of applications ranging from mobile devices to fixed devices.

Projected Capacitive Technology (PCT) is becoming one of the most significant touch technologies for applications ranging from mobile devices to collaborative business and development. PCT refers to two main sensing methods called "self-capacitance" and "mutual capacitance" offering different performance characteristics and applications. Driven by the increasing number of users of touch-enabled mobile devices, consumer and professional expectations for touch applications have moved far beyond single-touch requirements into the realm of multi-touch and multi-user capabilities.

However, there has been a prejudice (or at least it has been considered to be a difficult challenge) that touch sensors based on PCT with a diagonal exceeding 32 inches might not be possible to build. However, such large projected capacitive touch sensors may be needed in collaborative business, research or and development.

Thus there exists a need for large projected capacitive touch sensors that can offer performance characteristics similar to smaller touch sensor devices such as tablet PCs or laptops.

SUMMARY

The present disclosure relates to a projected capacitive touch sensor of large sizes, e.g. with a diagonal above 32 inches and preferably up to 150 inches. Specifically, a projected capacitive touch sensor is provided with reduced Moiré effect and/or reduced electrical losses.

One or more of the following aspects of this disclosure can be implemented alone or in combination in a touch display device comprising the corresponding components. One or more of the following aspects of this disclosure can be embodied alone or in combination as manufacturing methods that include operations for production of the corresponding components.

In a general aspect 1, a projected capacitive touch sensor comprises: a sensor grid including one or more electrically conductive rows and one or more electrically conductive columns, and wherein one or more of the rows, or one or more of the columns, include one or more electrically conductive tiles, wherein each tile includes multiple electrically connected elements with pseudo-random orientation.

In a general aspect 2, a method of designing a layout for tiles for an electrode of a touch sensor, the method comprising: generating, by a processing device, the layout for one or more tiles based on multiple geometric elements, wherein the generating of the layout of the one or more tiles includes: pseudo-randomly assembling, by the processing device, the geometric elements so that the assembled elements have a pseudo-random orientation.

In a general aspect 3, a method of manufacturing a projected capacitive touch sensor, the method comprising: manufacturing a sensor grid, the forming of the sensor grid comprising: forming electrically conductive rows in an at least partially transparent row layer; forming a layer of electrically conductive columns in an at least partially transparent column layer; wherein one or more of the rows, or one or more of the columns, include one or more electrically connected tiles manufactured according to the layout of aspect 2; and providing one or more electrical connectors for electrical connection of the rows and the columns of the sensor grid to a controller.

Aspect 4 according to any one of aspects 1 to 3, wherein the one or more electrically connected tiles are a sequence of tiles, wherein each of the multiple elements of the respective tile in the sequence is configured to conduct a portion of an electrical signal, which was received at the respective tile, across the respective tile and to a neighboring tile in the sequence.

Aspect 5 according to any one of aspects 1 to 4, wherein at least one of the elements is congruent to another one of the elements, but is not obtainable from the other one of the elements by a geometric operation not including a rotation or not including a mirroring, or wherein at least one of the elements is congruent to another one of the elements, but is not obtainable from the other one of the elements by a translation only.

Aspect 6 according to any one of aspects 1 to 5, wherein the one or more electrically connected tiles are a sequence of tiles, and wherein neighboring tiles in the sequence are electrically interconnected by two or more electrical wires or traces, preferably wherein the width of each of the two or more wires or traces is 0.5 to 10 micrometers, more preferably wherein the width of each of the two or more wires or traces is about 5 or 8 micrometers.

Aspect 7 according to any one of aspects 4 to 6, wherein one or more boundaries of each of the multiple elements include an electrically conductive trace, preferably wherein the width of the trace is 0.5 to 10 micrometers, more preferably wherein the width of the trace is about 5 or 8 micrometers.

Aspect 8 according to any one of aspects 1 to 7, wherein the sensor grid is configured to detect a perturbation on an electrostatic field generated at an interception between one of the rows and one of the columns, the perturbation caused by an external conductive object, preferably wherein the external object is a finger or a conductive object.

Aspect 9 according to any one of aspects 1 to 8, wherein the diagonal of the sensor grid exceeds 32 inch, and wherein the longest distance between two points, connected by a straight line, within each element is between 100 and 800 micrometer, preferably between 200 and 700 micrometer, more preferably between 300 and 600 micrometer, most preferably about 450 micrometer long.

Aspect 10 according to any one of aspects 1 to 9, wherein the height of the tiles is more than 0.5% of the height of the sensor grid, or wherein the width of the tiles is more than 0.2% of the width of the sensor grid.

Aspect 11 according to any one of aspects 1 to 10, wherein the one or more electrically connected tiles are a sequence of tiles, and wherein the sequence of electrically connected tiles is of zig-zag shape.

Aspect 12 according to any one of aspects 1 to 11, wherein the rows are arranged in a row layer and the columns are arranged in a column layer that is spaced apart from the row layer, and wherein none of the rows is directly electrically connected with any of the columns, preferably wherein the row layer and the column layer are connected by a non-conductive optical clear adhesive (OCA).

Aspect 13 according to any one of aspects 1 to 12, wherein the rows are arranged in a row layer and the columns are arranged in a column layer that is spaced apart from the row layer, one or more of the rows and one or more of the columns including one or more electrically connected tiles, wherein each tile includes multiple electrically connected elements with pseudo-random orientation, and wherein projections of the tiles of the rows onto the column layer at least partially cover regions in the column layer that are not covered by tiles of the columns, optionally: wherein projections of the tiles of the columns onto the row layer at least partially cover regions in the row layer that are not covered by tiles of the rows, preferably: wherein the regions are devoid of any respective row and column electrode material, or wherein the regions are devoid of any of the electrically connected elements from the respective row and column layer.

Aspect 14 according to aspect 13, wherein neighboring tiles in the rows and columns are electrically interconnected by two or more electrical wires forming a bridge, and wherein projections of the bridges between the tiles of the rows onto the column layer intersect with the bridges between the tiles of the columns under an angle of 80 to 100 degrees, preferably of about 90 degrees Aspect 15 according to aspect 14, wherein the bridge is aligned under an angle of 30 to 60 degrees, preferably 45 degrees, with respect to pixel rows or pixel columns of a display pixel grid associated with the touch sensor.

Aspect 16 according to any one of aspects 1 to 15, wherein the rows and columns are attached to a layer shared by the rows and columns, wherein the rows are attached to a first surface of the shared layer and wherein the columns are attached to a second surface of the shared layer, wherein the first surface is opposite the second surface.

Aspect 17 according to any one of aspects 1 to 16, wherein the rows are arranged in a row layer and the columns are arranged in a column layer, wherein the row layer and the column lower are each made of one or more semiconductor materials that are at least partially transparent to visible light.

Aspect 18 according to any one of aspects 1 to 17, wherein at least one of the elements is congruent to another one of the elements, and is obtainable from the other one of the elements by a rotation of above 0 degrees and below or equal 180 degrees, preferably of above 0 degrees and below or equal 90 degrees, more preferably of about 45 degrees, most preferably of about 60 degrees.

Aspect 19 according to any one of aspects 1 to 18, wherein at least one of the elements is congruent to another one of the elements, but is not obtainable from the other one of the elements by a geometric operation not including a rotation or not including a mirroring.

Aspect 20 according to any one of aspects 1 to 19, wherein at least one of the elements is congruent to another one of the elements, but is not obtainable from the other one of the elements by a translation only.

Aspect 21 according to any one of aspects 1 to 20, wherein at least one of the elements is congruent to another one of the elements, but is obtainable from the other one of the elements by one or more mirroring operations.

Aspect 22 according to any one of aspects 1 to 21, wherein the pseudo-random orientation of the elements is determined by a random generator.

Aspect 23 according to any one of aspects 1 to 22, wherein the elements include at least one of hexagon, triangle, rectangle, diamond, parallelogram, trapezoid, ellipsoid, octagon, dodecahedron, or T-shaped geometric form.

Aspect 24 according to any one of aspects 2 to 23, further comprising: optically coupling a display layer to the sensor grid, wherein the sensor grid is configured to be at least partially transparent for information displayed by the display layer, preferably wherein the display layer is a liquid crystal display device.

Aspect 25 according to any one of aspects 1 to 24, wherein the elements include hexagons that each have three interior traces with distinct lengths having a non-centric common origin, and wherein the hexagons are rotated in multiples of 60 degree angle to render at least a portion of the pseudo-random orientation.

In a general aspect 26, a computer-readable storage medium comprises computer-readable instructions which, when executed by one or more computers, cause the one or more computers to perform operations according to any one of aspects 2-25.

The details of these and other aspects and embodiments of the present disclosure are set forth in the accompanying drawings and the description below. Other features, objects, and advantages of the disclosure will be apparent from the description and drawings, and from the claims.

DESCRIPTION OF DRAWINGS

FIG. 2 illustrates components of a projected capacitive touch sensor.

FIGS. 8A-B illustrate double-wire configurations and signal flow paths for the rows and columns of the sensor grid, exemplary shown for the elements used in the embodiment of FIG. 7C.

DETAILED DESCRIPTION

The present disclosure relates to a projected capacitive touch sensor of large sizes, e.g. with a diagonal above 30 inches and preferably up to 150 inches. Specifically, a projected capacitive touch sensor is provided with reduced Moiré effect and/or reduced electrical losses.

First, optical interferences, such as the Moiré effect, originating from layer stacks in the touch sensor may be significantly reduced (or even substantially suppressed) to allow scaling of projected capacitive touch sensors to large sensor diagonals exceeding of 32 inches, even up to 150 inches.

Second, ohmic resistance and signal dissipation in the electrode layers can be reduced to a regime that allows scaling of projected capacitive touch sensors to large sensor diagonals exceeding of 32 inch, even up to 150 inches.

Third, even at these large sizes, a layer transparency and a touch sensitivity are achieved that offer touch display performance characteristics similar to smaller touch sensor devices such as tablet PCs or laptops.

Fourth, the touch sensor grid may be fabricated on flexible substrates providing touch experiences at large-area walls and floors similar to smaller touch sensor devices such as tablet PCs or laptops.

Fifth, the large projected capacitive touch sensor described in the present disclosure may allow more efficient collaborative research and development involving multiple researchers or developers. This sensor may assist technical experts in logistics, construction work, machine development, or computing environments in developing optimized products or services.

Figure 1:
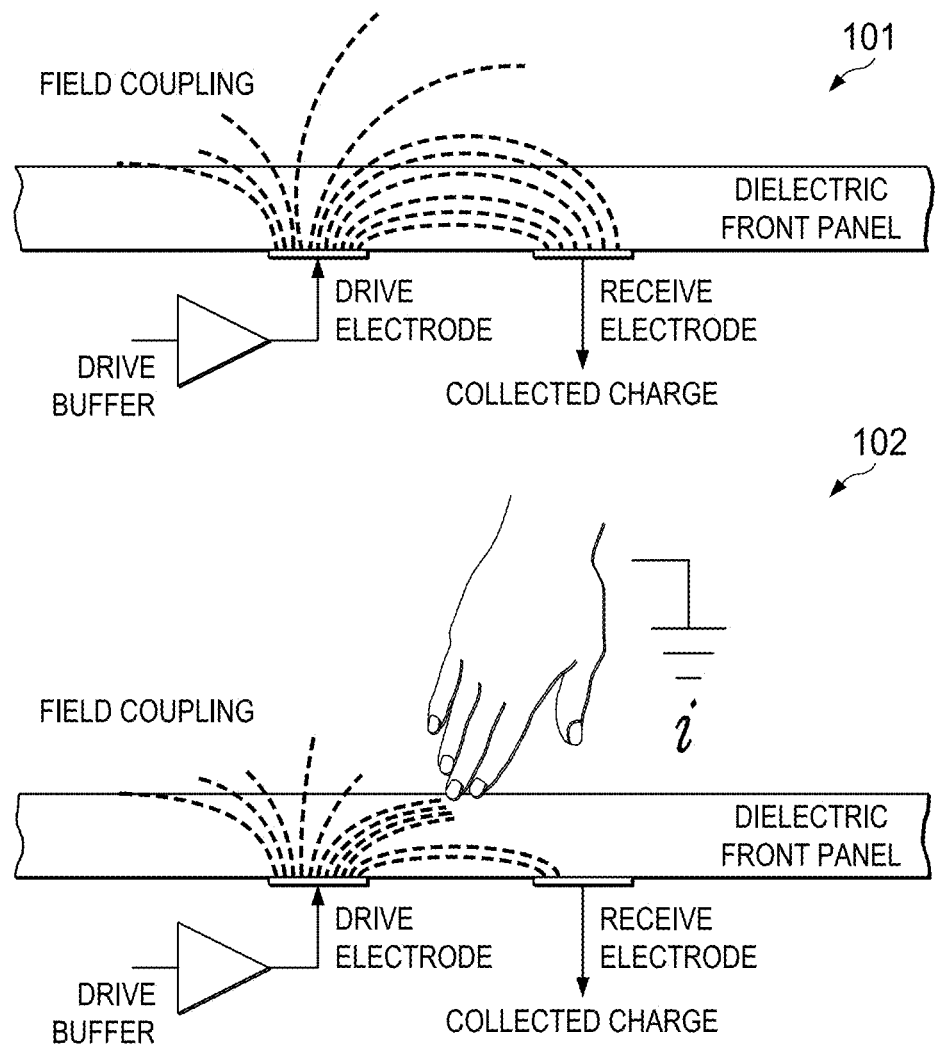
FIG. 1 illustrates in a simplified manner how projected capacitive touch sensing works.

FIG. 1 illustrates, in a simplified manner, the working principles of projected capacitive touch sensing technology. 101 is the sensor without an external conductive object in close proximity, while 102 is the sensor with an external conductive object in close proximity. PCT may be based on a grid (or matrix) made of electrically conductive material, having this material as columns and rows. The columns and rows may serve as electrodes. The detection method may be based on interference caused by an external conductive touch object (e.g., finger or conductive pointer that are grounded) on the electrostatic field generated between the rows and columns, more precisely at the interceptions between rows and columns—these interceptions may be designated as nodes. These nodes, electrically speaking, may behave like capacitors, with very low charge capacity, in the pico Farad (pF) range, and with charge variation in the femto Farad (fF) range when externally disturbed (for instance, when touching with the external object). In other words, PCT detects touch by measuring the capacitance at each addressable electrode. When a finger or a conductive object approaches an electrode, it disturbs the electromagnetic field and alters the capacitance. This change in capacitance can be measured by the electronics and then converted into X, Y locations that the system can use to detect touch.

FIG. 2 illustrates components of a projected capacitive touch sensor 200. In an aspect, an alternate current signal is injected (AC signal) in one of the rows 203 and, on each column 201, one may find the same signal with a fraction of the injected signal amplitude. The signal amplitude obtained on each column is the result of the original AC signal passing through the capacitor 202 created at the node (interception) between the selected row and the column. This sensor output amplitude may vary between columns due to physical and electrical differences that may exist for among columns (e.g., equivalent capacitors to each node have different charge capacities, thereof, different output signal values or amplitudes). For example, the electrical signal may be injected in the rows and collected at the columns, but the process works in reverse (one can inject the signals in the columns and collect it at the rows).

The signal amplitude at the columns output may be changed (e.g., it will be smaller or larger) when a conductive object, exterior to the grid, disturbs the electrostatic field created at the node between the row and column. This conductive object is, in this circuit context, the touching or "getting near" finger in the grid which will divert part of that electrostatic field to earth/ground. One may use this difference of signal amplitude (amplitude without touch minus amplitude with touch) to identify the presence of an exterior conductive object, thus, the existence of a touch event.

There are two main types of sensing methods, self-capacitance and mutual capacitance, where each has its own advantages and disadvantages. While for self-capacitance, each electrode is scanned individually, in mutual capacitance each electrode node or intersection is scanned for the determination of a touch event. Mutual capacitance may allow an unlimited number of unambiguous touches, may produce higher resolution than self-capacitance and may be less sensitive to electromagnetic interference (EMI) than self-capacitance. In self-capacitance, due to the scanning method, so-called ghost points may occur so that it may not be possible to unambiguously detect more than one touch event when using rows and columns. However, both types of sensing methods are based on a charge transfer between human-body or touch object and either single electrode or pair of electrodes.

Mutual capacitance is the intentional or unintentional capacitance between two "charge holding objects." Projected capacitance touch-screens intentionally create mutual capacitance between elements of columns and rows in the vicinity where each intersect the other. This allows the system electronics to measure each node (intersection) individually to detect multiple touches on the screen during one screen scan. When a touch object touches near an intersection or node, some of the mutual capacitance between the row and column is coupled to the touch object, which reduce the capacitance at the intersection as measured by the system electronics. This reduced capacitance crosses the "touch threshold" set by the electronics indicating a touch has occurred.

Touch sensors based on PCT may be scanned as mentioned above. The term "scanned" as used herein may mean that individual electrodes (e.g. rows or columns) intersections or nodes are measured, e.g. one-by-one in a cycle. Mutual-capacitance touch screens may use a scanning method that measures the capacitance at each row and column intersection. In this scanning method, the controller drives a single column (Y) and then scans every row (X) (or vice versa) that intersects with that column, measuring the capacitance value at each X-Y intersection. This process may be repeated for every column and then the entire cycle starts over. The scanning rate may be more than 20 Hz, for example, up to 200 Hz, 400 Hz, or 500 Hz. The sensor grid may have any number of columns and rows, for example, 64-700 columns and 36-400 rows, for example 168 columns and 96 rows.

Figure 3A:
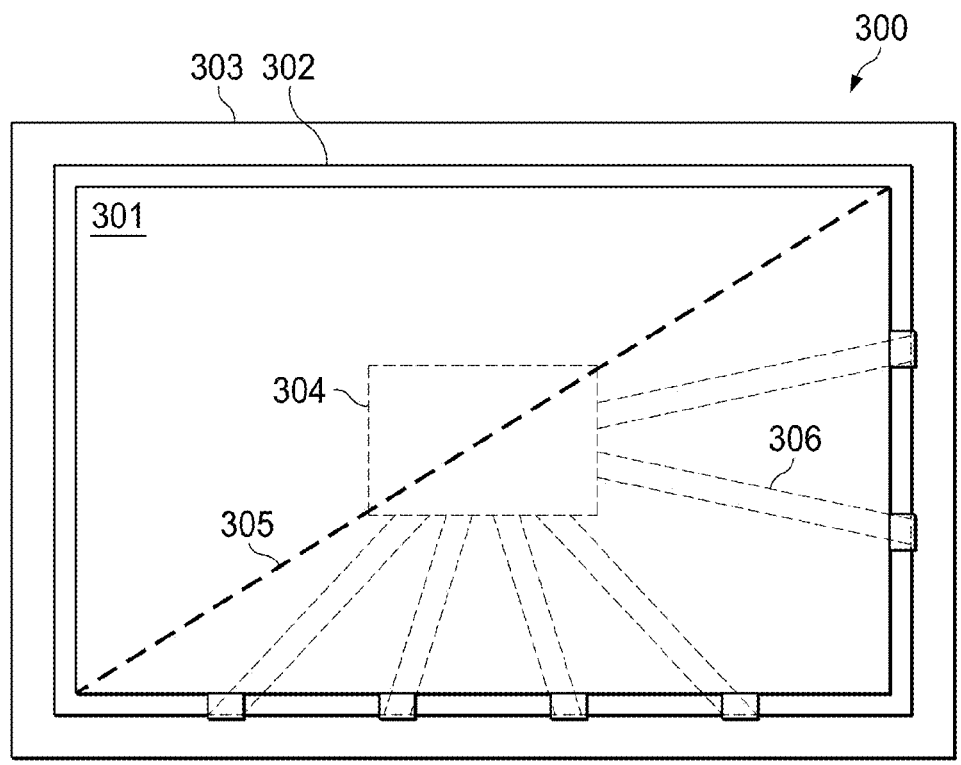
FIG. 3A illustrates a front view of a touch display device based on a projected capacitive touch sensor according to an embodiment of the present disclosure.
Figure 3B:
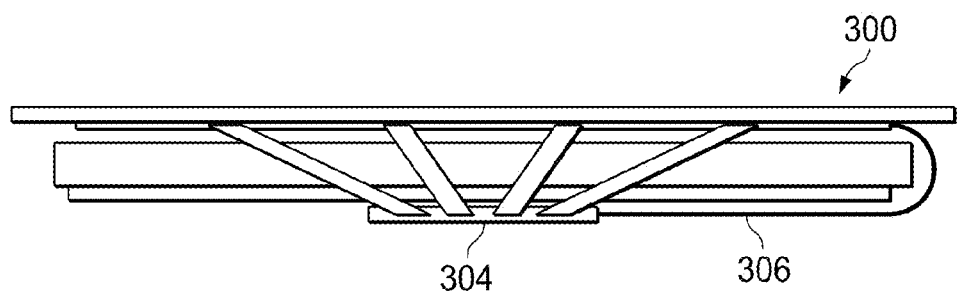
FIG. 3B illustrates a top view of a touch display device based on a projected capacitive touch sensor according to an embodiment of the present disclosure.

FIG. 3A illustrates a front view of the projected capacitive touch display device 300 and FIG. 3B illustrates a top view of the projected capacitive touch display device 300. The projected capacitive touch sensor may include a sensor grid 301 with diagonal 305, a display layer 302, a glass (or other transparent, non-conductive material, like acrylic) cover layer 303, one or more controllers 304 and one or more flexible cables 306. The controller, despite being shown at the back of the display, can be located anywhere as long as the flexible cables 306 coming from the sensor film can reach it. Not shown here is the host system (e.g., a regular PC) where the controller 304 and the display 302 are connected. The sensor grid 301 may be laminated to the glass 303 (or other transparent, non-conductive material, like acrylic). The diagonal 305 may exceed 32 inches, preferably may be 40 inches to 90 inches, more preferably may be up to 150 inches.

The layers forming the sensor grid 301, after being stacked up, may create a grid of interceptions between the conductive material (e.g., copper, gold, silver, carbon nanotubes, graphene; generically any conductive material which may allow fine traces, e.g. below 10 μm in width) rows and columns, which are previously created in one or more row or column layers by deposition, printing, etching, electroplating or other method of making conductive structures in (e.g. flexible) substrates (e.g.). Additionally, conductive connecting traces (e.g. buses) are also created at the borders in order to allow the electrical connection of the rows/columns to the flexible cables which will, then, connect to the controller. The rows and their traces may not directly (e.g., conductively) touch/connect electrically to the columns and column traces, e.g., there must may be electrical isolation between rows and columns, being it by spatial separation (zones where rows and columns do not overlap), or being it by using a isolating (e.g., electrically non-conductive) layer (e.g. an optically clear adhesive (OCA)) in between. The isolation material may act as dielectric, e.g., at the interception/node zones.

As used in the present disclosure, the term "controller" and "host system" is intended to encompass any suitable processing device. For example, although FIGS. 3A, 3B illustrate a single backend controller 304, touch display device 300 can be implemented using any number of controllers. Indeed, the controller 304 and the host system may be any computer or processing device such as, for example, a blade server, general-purpose personal computer (PC), Macintosh®, workstation, UNIX®-based workstation, or any other suitable device. In other words, the present disclosure contemplates computers other than general purpose computers, as well as computers without conventional operating systems. Further, the illustrated controller 304 and the host system may be adapted to execute any operating system, including Linux®, UNIX®, Windows®, Mac OS®, or any other suitable operating system. The controller and/or host system may be configured to execute any computer instructions or software that can be used to operate the touch display device 300 or that can provide functionality for one or more users of the touch display device 300, wherein the users may activate the functionality through touching predetermined locations on the cover layer 303, and wherein the touched location is associated with an icon displayed by the display layer 302, and wherein the user-initiated touch event is sensed by the sensor grid 301 and the controller 304. In this manner, the user may activate software or hardware functionality by perturbing the electrical field at a node of a row and a column of the sensor grid 301 by using a finger or a conductive object. For example, the perturbation of the electrical field triggers an action of software running on the controller 304 or host system.

Figure 4A:
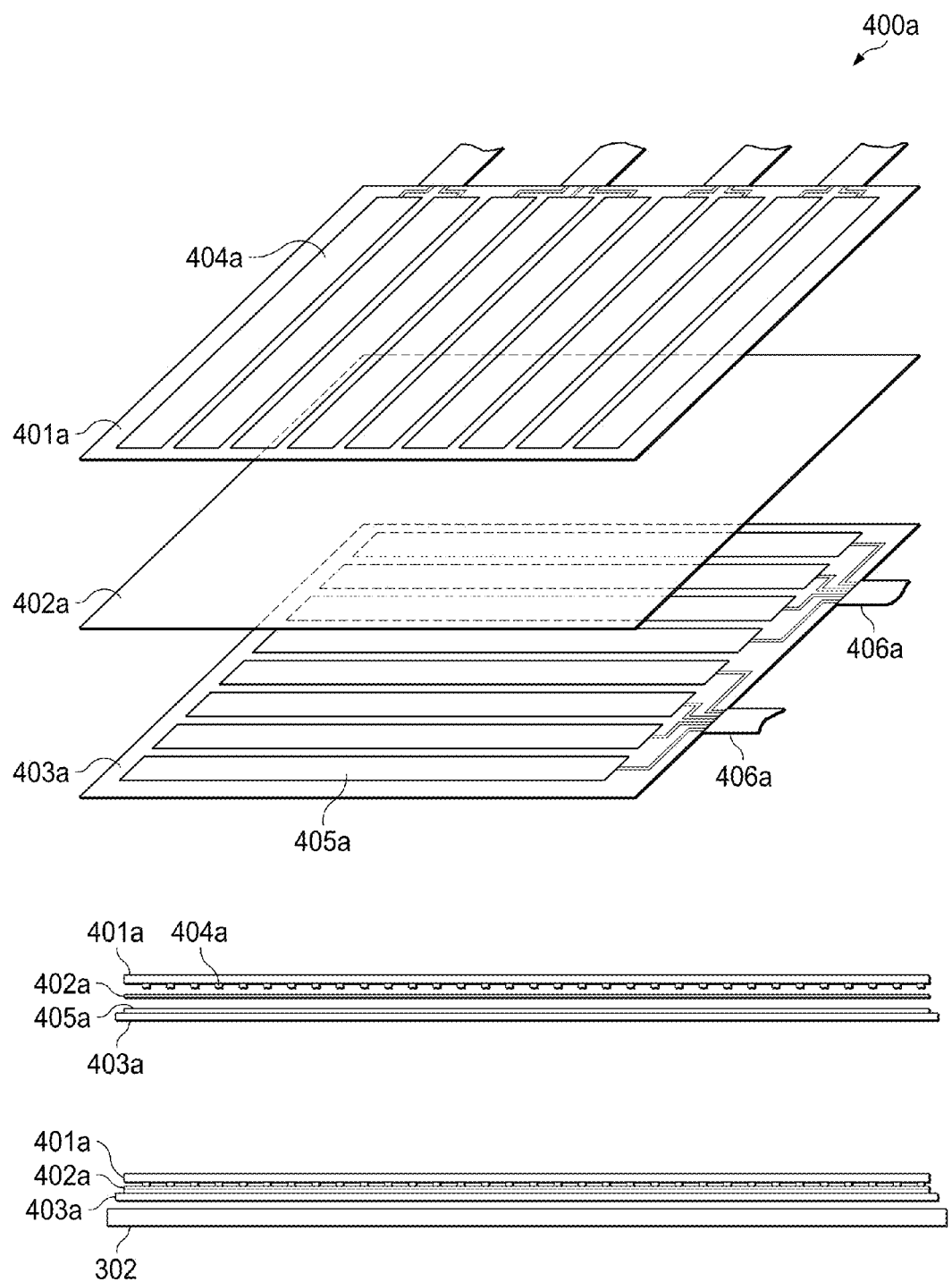
FIG. 4A illustrates layers of the sensor grid in a face-to-face stacking according to an embodiment of the present disclosure.

FIG. 4A illustrates layers of the sensor grid 301, 400a in a face-to-face stacking according to an embodiment of the present disclosure. The sensor grid may comprise one or more layers, which may be at least one of: conductive row layer 403a, conductive column layer 401a, optically clear adhesives 402a, substrates, covers, or additional dielectric bridges. For example, the sensor grid 301, 400a may include a conductive row layer 403a, a conductive column layer 401a and an optically clear adhesive (OCA) 402a. The rows 405a and columns 404a may be electrodes that are conductively connected via cables or wires 406a with the controller 304. FIG. 4A illustrates the sensor grid before and after lamination, and relative to the display layer 302. The materials used for the bridges and the OCA may be optically clear or transparent, and/or flexible materials, for example, materials with maximum haze below about 1%, and/or, with minimum light transmission, for example, above about 99%, for example an acrylic adhesive. The properties for bridge material may be: transparent, non-conductive, flexible, and/or dielectric constant substantially equivalent to glass, acrylic, or polyester.

The sensor grid layers stacking may be dependable on how the conductive rows and columns are created. There are three layer stacking configurations normally used: separated rows and columns layers facing each other (face to face stacking, FIG. 4A), rows and columns in the same layer (bridged stacking, FIG. 4B), rows and columns on opposite side of the same layer (dual side, FIG. 4C). The substrate layers (where the rows and columns will be created) and the cover layers may be polyethylene terephthalate (PET) films or other types of at least partially transparent (e.g. within or across the visible spectrum) and flexible materials. For example, polymethylpentene (PMP), polypropylene (PP), polycarbonate (PC), polyvinyl chloride (PVC), poly(methyl methacrylate) (PPMA), polystyrene (PS), styrene acrylonitrile (SAN), among others. Also, a flexible glass material can be used. In the next sub-sections, the aforementioned configurations are illustrated.

In this face-to-face stacking configuration 400a, the rows and the columns are created in separated layers, with the printed side facing each other. To isolate them electrically and, at the same time, act as dielectric, and to bond them when laminated, one may use a non-conductive layer of optically clear adhesive (OCA). The flexible cables may be bonded or soldered to the corresponding traces or buses (before or after the layer lamination, depending on the production process used).

Figure 4B:
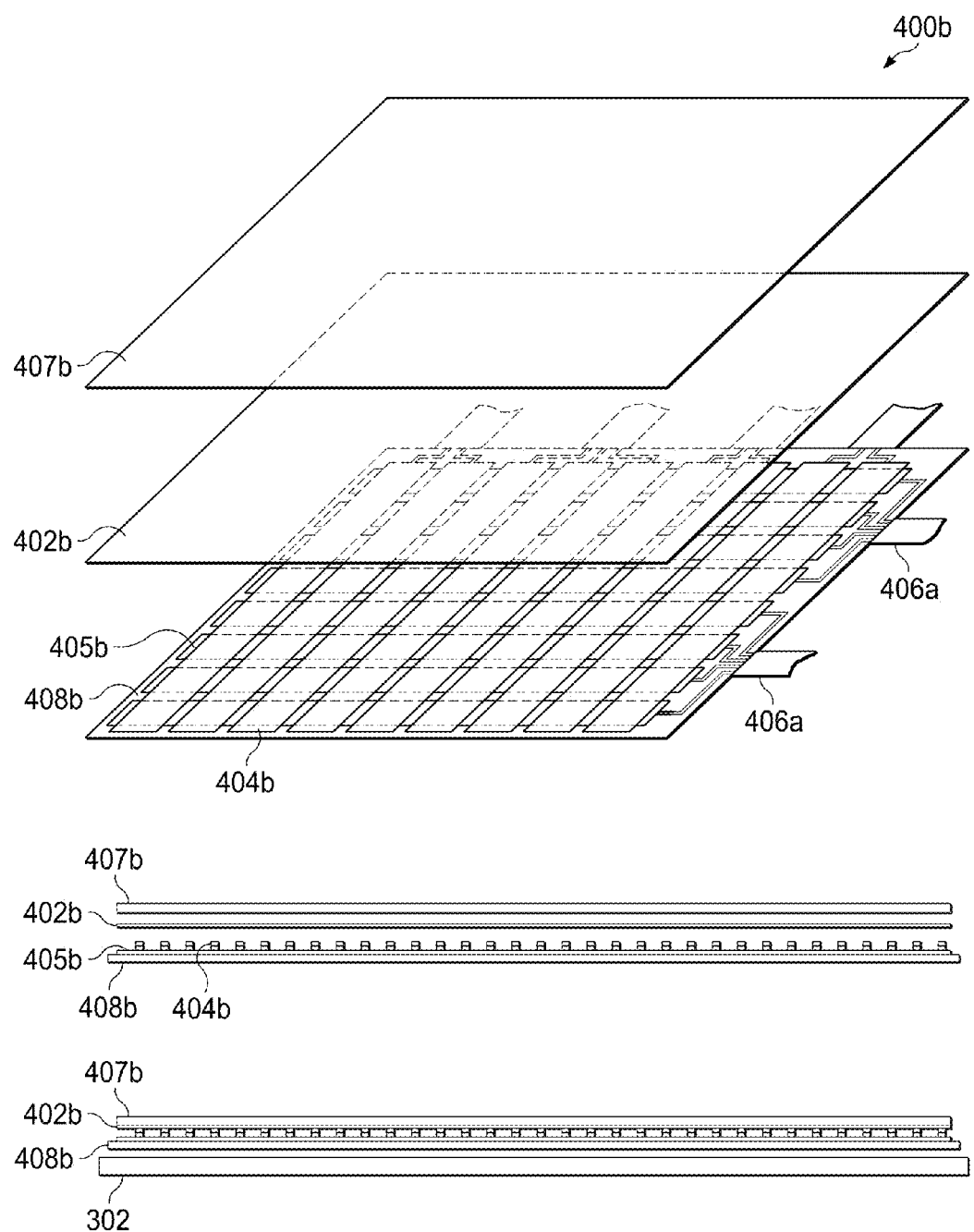
FIG. 4B illustrates layers of the sensor grid in a bridged stacking according to an embodiment of the present disclosure.

FIG. 4B illustrates layers of the sensor grid 301, 400b in a bridged stacking according to an embodiment of the present disclosure. The sensor grid may comprise one or more layers, which may be at least one of: a layer 408b shared by conductive rows 405b and conductive columns 404b, optically clear adhesives 402b, substrates, covers 407b, or additional dielectric bridges. For example, the sensor grid 301, 400b may include a layer 408b shared by conductive rows 405b and conductive columns 404b (e.g., rows and columns in the same layer 408b), and an optically clear adhesive (OCA) positioned between each row 405b and column 404b at the respective row-column-nodes. The rows 405b and columns 404b may be electrodes that are conductively connected via cables or wires 406a with the controller 304. FIG. 4B illustrates the sensor grid before and after lamination, and relative to the display layer 302.

In this bridged stacking configuration 400b, the rows and the columns may be created in the same layer 408b, having a transparent non-conductive material (e.g. OCA) between them where their projections spatially overlap. These non-conductive material blocks are called dielectric bridges. They may isolate electrically the rows and columns and act as dielectric. Also, it is used a cover layer to close and protect the rows and columns traces and an OCA layer to bond them when laminated. The flexible cables 406a may be bonded or soldered to the corresponding buses (before or after the layer lamination, depending on the production process used).

Figure 4C:
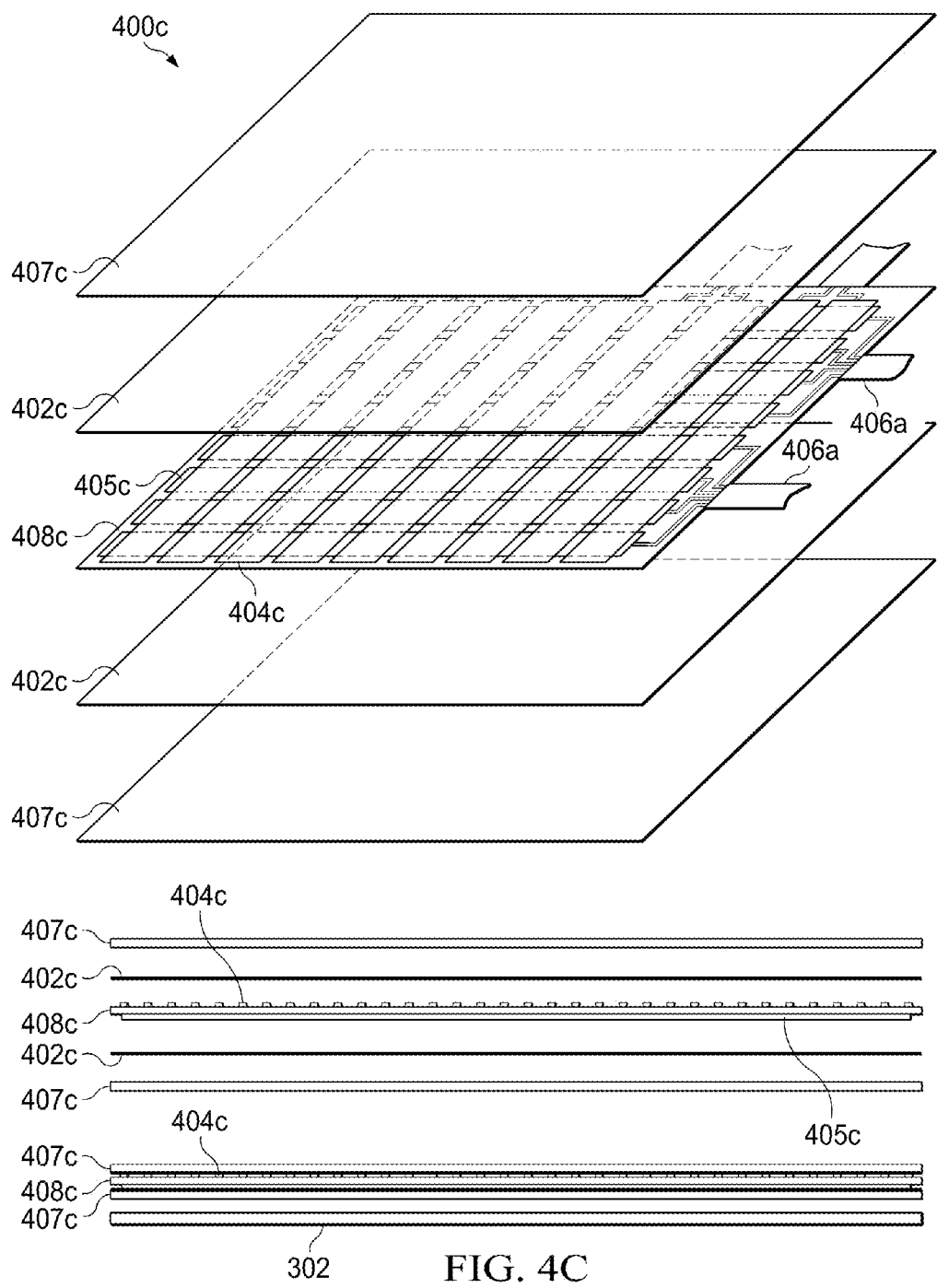
FIG. 4C illustrates layers of the sensor grid in a dual-side stacking according to an embodiment of the present disclosure.

FIG. 4C illustrates layers of the sensor grid 301, 400c in a dual-side stacking according to an embodiment of the present disclosure. The sensor grid may comprise one or more layers, which may be at least one of: a layer 408c shared by conductive rows 405c and conductive columns 404c, optically clear adhesives 402c, substrates, covers 407c, or additional dielectric bridges. For example, the sensor grid 301, 400c may include a layer 408c shared by conductive rows 405c and conductive columns 404c (e.g., rows and columns on opposite side of the same layer 408c), and one or more optically clear adhesive (OCA) layers positioned between layer 408c and one or more cover layers 407c. The rows 405c and columns 404c may be electrodes that are conductively connected via cables or wires 406c with the controller 304. FIG. 4B illustrates the sensor grid before and after lamination, and relative to the display layer 302.

In this dual-side stacking configuration 400c, the rows and the columns may be created in the same layer 408c, but on opposite sides, e.g., having the layer substrate 408c, the rows are created on the top side (e.g. top surface) and the columns on the bottom side (e.g., bottom surface), or vice-versa, of the shared layer 408c. The substrate layer may act as isolator and a dielectric. One may use a cover layer 407c on each side of the layer 408c to close and protect the rows and columns traces and the one or more OCA layers 402c, e.g., also on each side to bond them when laminated. The flexible cables 406a connect the rows and columns to the controller 304, e.g. cables 406a may be bonded or soldered to the corresponding traces or buses (before or after the layer lamination, depending on the production process used).

Figure 5A:
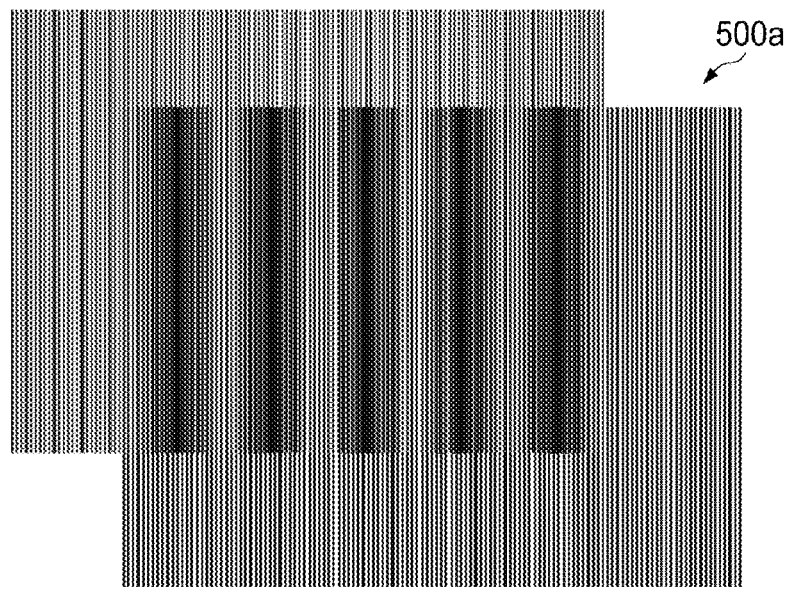
FIG. 5A illustrates an example of the Moiré effect in case of two parallel overlapping grids with slightly different periodicity.
Figure 5B:
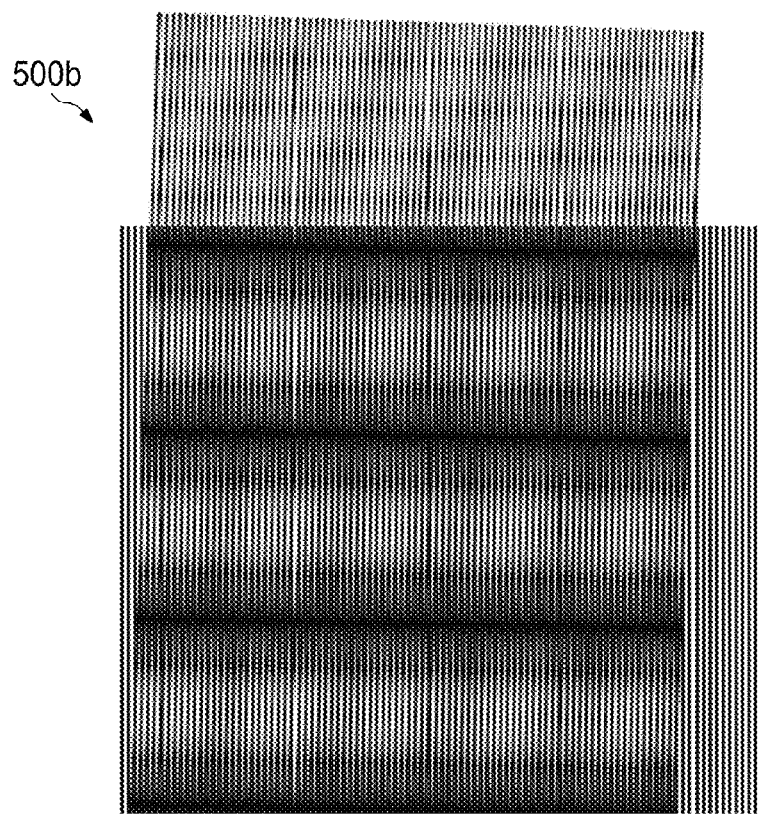
FIG. 5B illustrates an example of the Moiré effect in case of two overlapping grids with substantially identical periodicity but with one of the grids rotated with respect to the other grid.

FIG. 5A illustrates an example of the Moiré effect in case 500a of two parallel overlapping grids with slightly different periodicity. FIG. 5B illustrates an example of the Moiré effect in case 500b of two overlapping grids with substantially identical periodicity but with one of the grids rotated with respect to the other grid. In physics, mathematics, and art, a moiré pattern is a secondary and visually evident superimposed pattern created, for example, when two identical (usually semi-transparent) patterns on a flat or curved surface (such as closely spaced straight lines drawn radiating from a point or taking the form of a grid) are overlaid while displaced or rotated a small amount from one another. The overlap of two layers with fine periodicity may lead to a optically visible rough periodicity similar to interferences. Sources of this effect may may (i) two stacked layers with substantially identical periodicity are angularly detuned by rotating one layer with respect to the other layer (FIG. 5B), or (ii) two overlapped layers have slightly detuned periodicity but are substantially only translated with respect to each other (FIG. 5A), or (ii) two overlapped layers have slightly detuned periodicity but are substantially rotated and translated with respect to each other. The Moiré effect may disturb the information displayed by the display layer 302 so that blurred information may be presented to the user.

Figure 6:
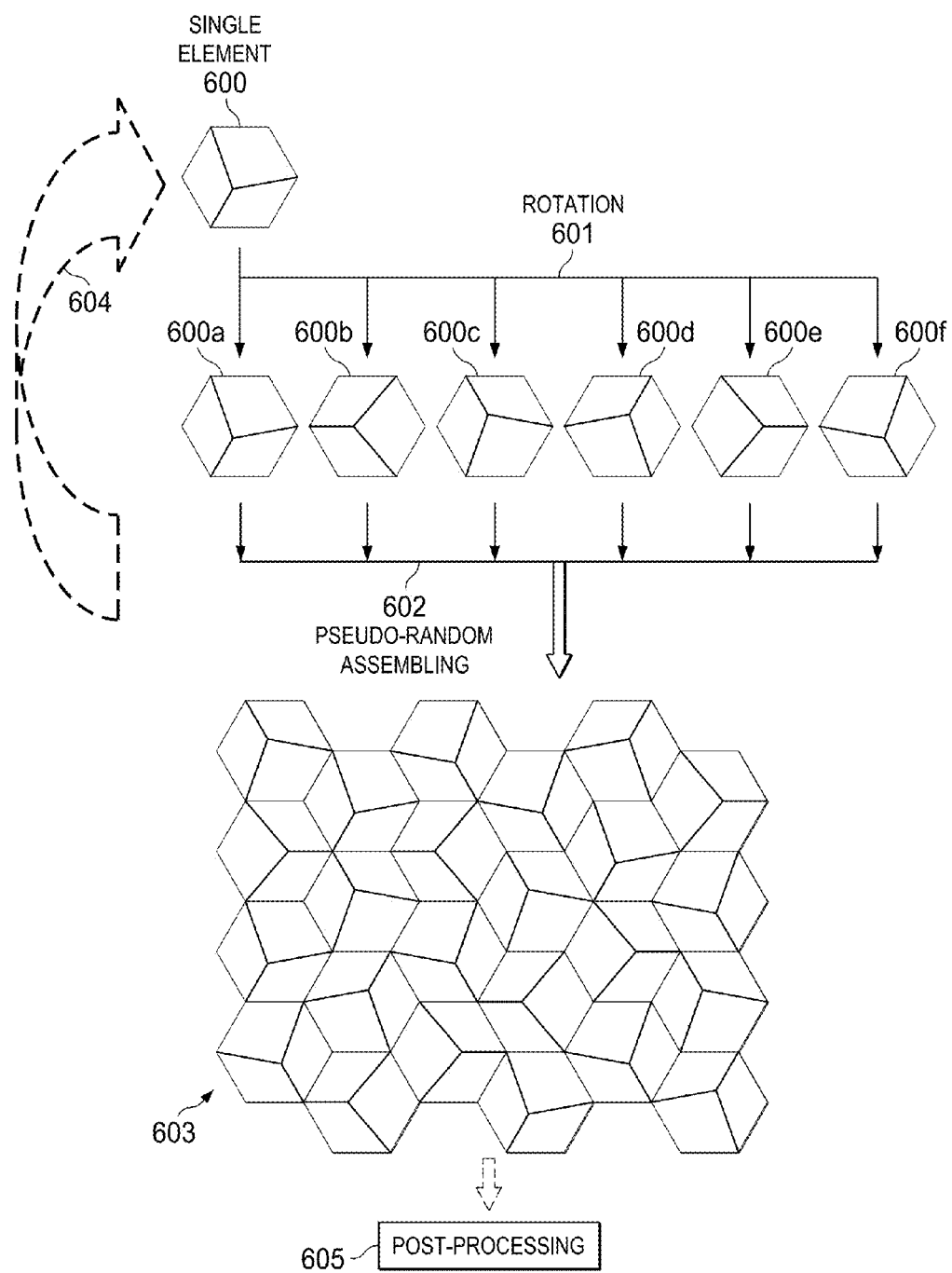
FIG. 6 illustrates a method of composing tiles of pseudo-randomly assembled elements, for the exemplary element of a hexagon, according to an embodiment of the present disclosure.

FIG. 6 illustrates a method of composing tiles 603 of pseudo-randomly assembled elements 600a-f, for the exemplary element of a hexagon 600, according to an embodiment of the present disclosure. In an aspect, a method of designing a layout for tiles 603 for an electrode of a touch sensor comprises: generating, by a processing device, the layout for one or more tiles 603 based on multiple geometric elements 600a-f, wherein the generating of the layout of the one or more tiles 603 includes: pseudo-randomly assembling 602, by the processing device, the geometric elements 600a-f so that the assembled elements 600a-f have a pseudo-random orientation. For example, the hexagon 600 has inside three traces with distinct lengths, thus, having a non-centric common origin. This hexagon can then be rotated pseudo-randomly, e.g., in multiples of 60 degree angle. For example, at least one of the elements 600a-f is congruent to another one of the elements 600a-f, and is obtainable from the other one of the elements by a rotation 601 of above 0 degrees and below or equal 180 degrees, preferably of above 0 degrees and below or equal 90 degrees, more preferably of about 45 degrees, most preferably of about 60 degrees. After the assembling of the elements, the method may repeat 604 the selection of the element and the rotation of the elements for a further assembling of elements to the already assembled elements. After finalizing the generation of the tile, the tile 603 may be post-processed 605, e.g. some of the boundaries of the elements 600a-f may be removed or broken up, or additional elements of the same or different shape may be added the assembled elements 600a-f in the tile 603.

In an aspect, at least one of the elements 600a-f is congruent to another one of the elements, but is not obtainable from the other one of the elements by a geometric operation not including a rotation or not including a mirroring. In an aspect, at least one of the elements 600a-f is congruent to another one of the elements, but is not obtainable from the other one of the elements by a translation only. In an aspect, at least one of the elements 600a-f is congruent to another one of the elements, but is obtainable from the other one of the elements by one or more mirroring operations. In an aspect, the pseudo-random orientation of the elements 600a-f is determined by a random generator. In an aspect, the elements 600a-f include at least one of hexagon, triangle, rectangle, diamond, parallelogram, trapezoid, ellipsoid, octagon, dodecahedron, or T-shaped geometric form.

In an aspect, a method of manufacturing the projected capacitive touch sensor 300 comprises: manufacturing a sensor grid 301, the forming of the sensor grid comprising: forming electrically conductive rows 405a-c in an at least partially transparent row layer; forming a layer of electrically conductive columns 404a-c in an at least partially transparent column layer; wherein one or more of the rows, or one or more of the columns, include one or more electrically connected tiles manufactured according to the tile layout 603 of FIG. 6; and electrically connecting the rows and columns of the sensor grid to the controller 304.

The forming of the layers may include laminating the layers. The rows and columns conductive traces may create a pattern, which can be visible, especially when the conductive material is not transparent. The sensor should thus be the semi-transparent to visible light to avoid visual interferences (hazing, blurring, moiré effect). So, the rows and columns pattern may cover the less area as possible and may create a grid pattern that minimize (or even overcome)

visual interferences. The sensor gird transparency to visible light may from 80% (less acceptable) to 100% (ideal; more acceptable), preferable about 90%. The haze and blurring is caused by the conjunction of factors: trace width (the bigger the width, the more area is occupied), and trace pitch (medium distance between traces).

If the pattern creates a very narrow grid (very small pitch) with traces with a considerable width, the overall sensor foil light transmission will be affected, causing the display image to be hazed and/or blurred. Also, dependable on the pattern used, the trace pitch and the traces overall direction (or rotation) may have influence on the moiré effect, regarding the display pixel grid and display pixel pitch. For example, having a display pixel pitch near the pattern trace pitch and if the pixel grid and the trace grid are almost parallel, the moiré effect may be strong. The more parallel they are, the strongest may be the effect. Also, the more rectilinear the overall traces (considering one trace from one border to the opposite border, on the sensor foil) the stronger the moiré effect will be. The rotation angle of the pattern traces, regarding the display pixel grid, may range between 30 and 60 degrees (preferably 45 degrees). The traces pitch is dependable on the trace width (e.g., low trace pitch for high trace width may decrease sensor grid transparency), and on display pixel pitch (high trace pitch with low pixel pitch may make traces noticeable to the eye, especially if traces width is above 1.5 micrometers). For large format displays (e.g. exceeding 30 inches), where pixel pitch ranges from 1 mm to 0.2 mm, the trace pitch may be closer to the bottom of the mentioned range. Thus, the preferred range for sensor grid pattern trace pitch may be from 450 micrometer down to 150 micrometer. For example, the area occupied by traces in a 1 cm$^2$ layer area may be less than 10%, in order to achieve the desired transparency, e.g. above about 90% (e.g. across the visible spectrum). If the trace width is bigger than the pixel interval space (the trace area that separate the pixels) and, as bigger the trace width is, the more it may get closer to the pixel width, and then the traces may be noticeable to the eye because they start to hide partially or even totally the pixel. For example, for low pixel widths as 77.9141 micrometer (e.g. smart phones) or 96.212121 micrometer (e.g. tablet PCs), trace widths below 5 micrometers may be barely noticeable, with traces below 1.5 micrometers being substantially invisible.

The effective or final sensor grid pattern may be the result of the stacking or overlapping of the rows pattern and the columns pattern. The following figures and paragraphs present three exemplary usable patterns for sensor grids 700a-c according to embodiments of the present disclosure, decomposed in the rows and columns sub-patterns and how they overlap to create the effective or final sensor grid pattern. Other geometric shapes of the elements 600 can be envisioned and the embodiments described herein provide guidance how to achieve preferred patterns for large projected capacitive touch sensors.

Figure 7A:
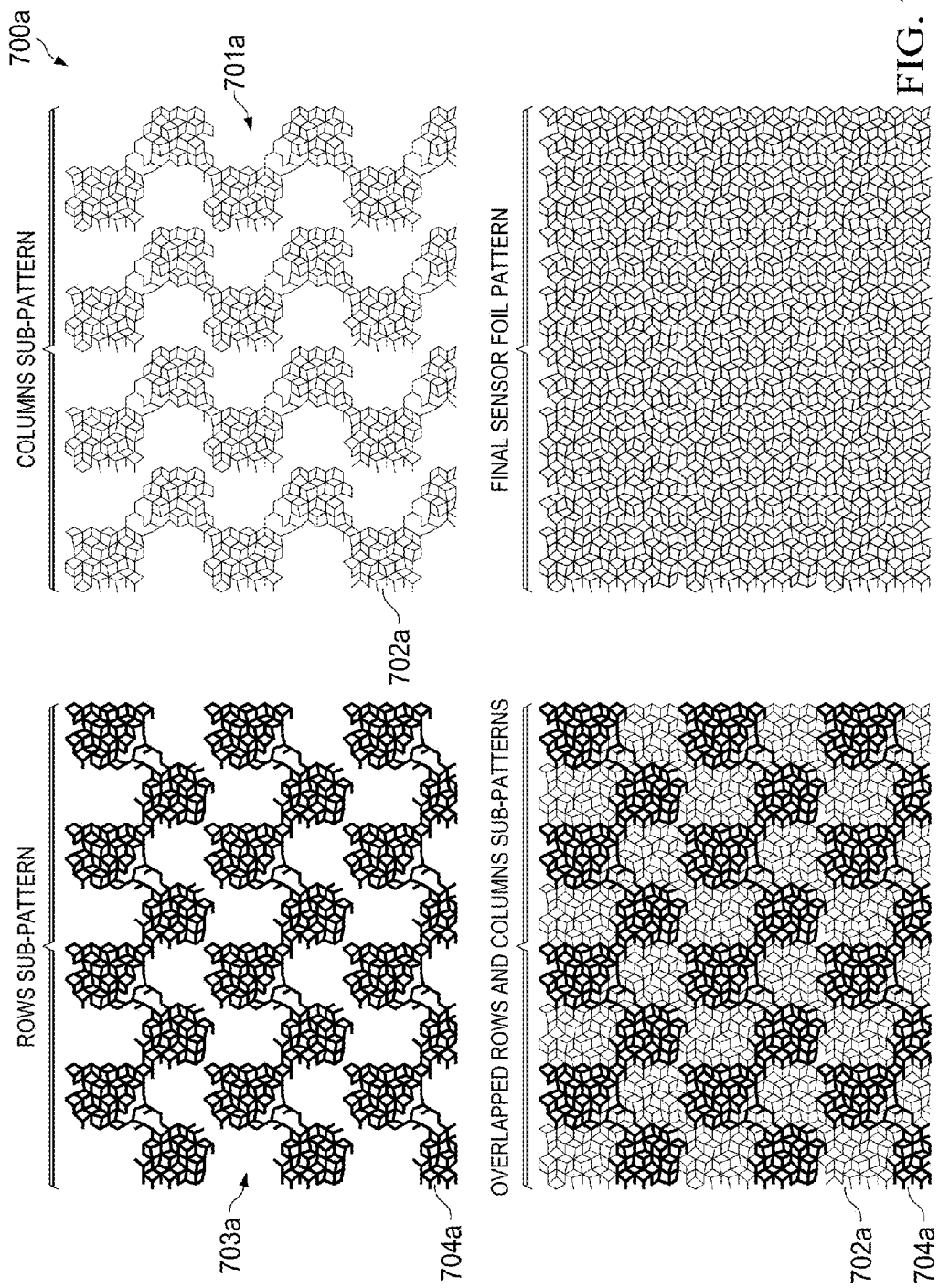
FIG. 7A illustrates a top view of the conductive rows and conductive columns of the sensor grid, wherein the rows and columns are each based on a sequence of tiles composed of pseudo-randomly assembled hexagons.

FIG. 7A illustrates a top view of the conductive rows and conductive columns of the sensor grid. In this embodiment, the sensor grid includes one or more electrically conductive rows and one or more electrically conductive columns, wherein the rows are arranged in a row layer and the columns are arranged in a column layer that is spaced apart from the row layer, one or more of the rows and one or more of the columns including one or more electrically connected tiles, wherein each tile includes multiple electrically connected elements with pseudo-random orientation, and wherein projections of the tiles of the rows onto the column layer at least partially cover regions in the column layer that are not covered by tiles of the columns, preferably wherein projections of the tiles of the columns onto the row layer at least partially cover regions in the row layer that are not covered by tiles of the rows. In this embodiment of FIG. 7A, the rows and columns are each based on a sequence of tiles composed of pseudo-randomly assembled hexagons. This effective or final sensor pattern (pattern in the bottom row to the right) of the sensor grid 700a may be rendered by the tiles (or their projection onto the column layer) of the row layer filling up the gaps (or regions) in the column layer and vice versa. The effective or final sensor layer may be constructed using an hexagon which have inside three traces with distinct lengths, thus, having a non-centric common origin. This group can then be rotated pseudo-randomly, e.g., in multiples of 60 degree angle. Replicating this to fill the all sensor grid area, one can obtain a pseudo-random trace pattern. This pattern may be sliced in a way that parts of it will be the rows sub-pattern and the others the columns. The hexagons size may range from 600 µm to 300 µm, e.g., to maintain the overall trace pitch inside the 450 µm down to 150 µm range. The trace width may range from 8 µm down to 1 µm (or less, depending on the sensor size—bigger sensor foil size means bigger resistance on each row/column and vice-versa). The traces in the rows and/or columns may be made of copper or any other suitable electrically conductive material.

In an aspect, the projected capacitive touch sensor comprises: a sensor grid including electrically conductive rows 703a and electrically conductive columns 701a, and wherein one or more rows, or one or more columns, include one or more electrically conductive tiles 704a, 702a, wherein each tile 704a, 702a includes multiple electrically connected elements 600a-f with pseudo-random orientation. In an aspect, the height of the tiles 704a, 702a is more than 0.5% of the height of the sensor grid, and/or wherein the width of the tiles 704a, 702a is more than 0.2% of the width of the sensor grid. In an aspect, the one or more electrically connected tiles 704a, 702a are a sequence of tiles, and wherein the sequence of electrically connected tiles is of zig-zag shape. In an aspect, projections of each row 703a or row tile 704a onto the column layer cover gaps or regions between the columns 701a within the column layer, which are not covered by tiles 702a of the columns.

In an aspect, the disorder obtained by pseudo-randomly orienting the elements 600a-f in the tiles 702a, 704a may lead to a reduction in Moiré effect as the substantially ordered display layer (e.g., LCD pixel array) 302 may be superposed (e.g. overlaid) with a substantially disordered effective sensor grid (e.g., row and columns layers) 301.

Figure 7B:
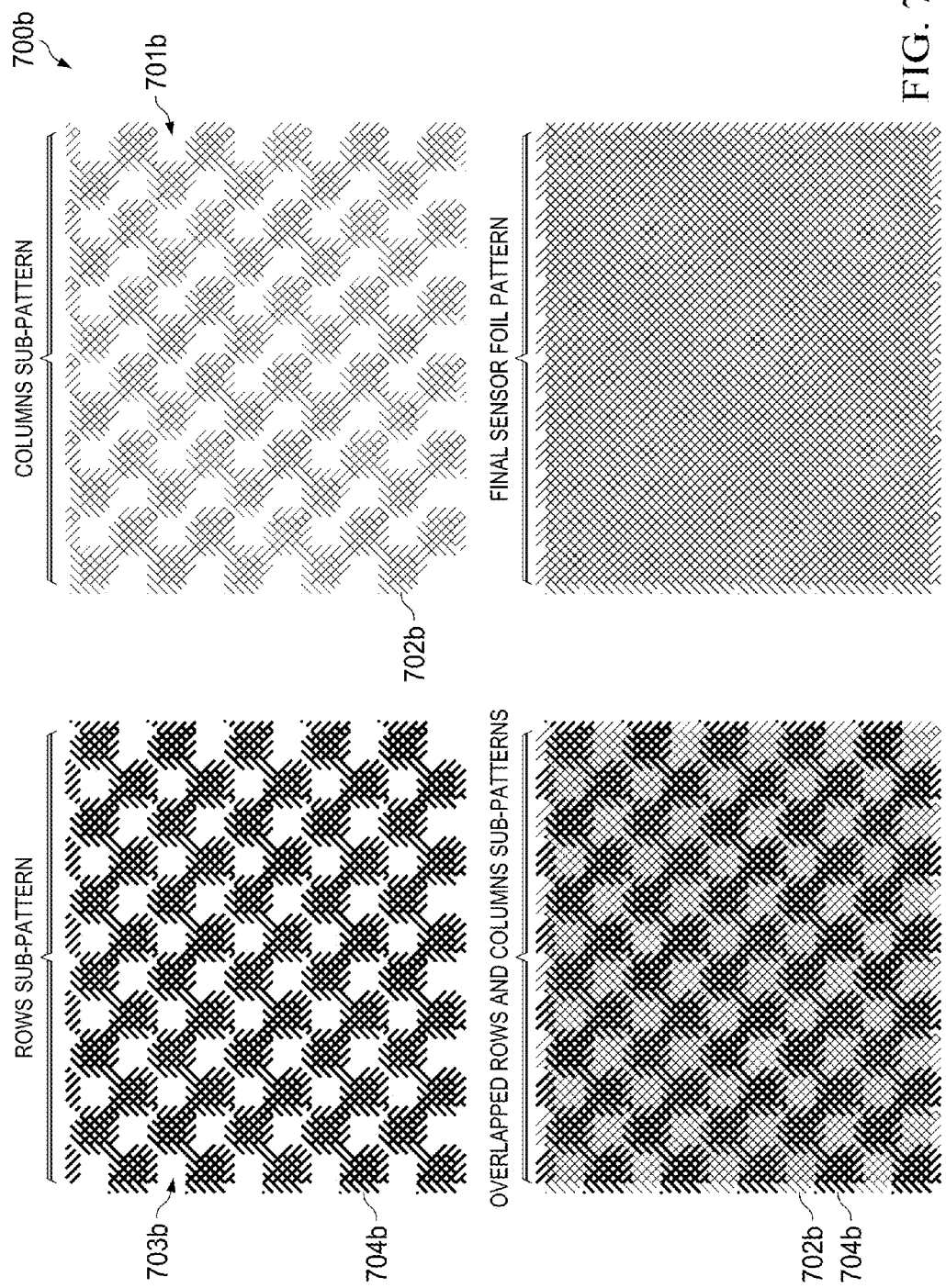
FIG. 7B illustrates a top view of the conductive rows and conductive columns of the sensor grid, wherein the rows and columns are each based on a sequence of tiles composed of pseudo-randomly assembled rectangles.

FIG. 7B illustrates a top view of the conductive rows and conductive columns of the sensor grid. In this embodiment, the sensor grid includes one or more electrically conductive rows and one or more electrically conductive columns, wherein the rows are arranged in a row layer and the columns are arranged in a column layer that is spaced apart from the row layer, one or more of the rows and one or more of the columns including one or more electrically connected tiles, wherein each tile includes multiple electrically connected elements with pseudo-random orientation, and wherein projections of the tiles of the rows onto the column layer at least partially cover regions in the column layer that are not covered by tiles of the columns, preferably wherein projections of the tiles of the columns onto the row layer at least partially cover regions in the row layer that are not covered by tiles of the rows. In this embodiment of FIG. 7B, the rows and columns are each based on a sequence of tiles composed of randomly assembled rectangles. This effective or final sensor pattern (pattern in the bottom row to the right) of the sensor grid 700b may be rendered by the tiles (or their projection onto the column layer) of the row layer filling up the gaps (or regions) in the column layer and vice versa. The effective or final sensor layer may be based on a rectangle (e.g. square), with a rotation of 45 degrees. Again, this pattern may be sliced in a way that parts of it will be the rows sub-pattern and the others the columns sub-pattern. The rectangle size (e.g., diagonal or edge) may range from 200 μm to 450 μm, e.g. to maintain the overall trace pitch inside the 450 μm down to 150 μm range. The trace width may range from 10 μm down to 0.5 μm (or less), depending on the sensor size: bigger sensor foil size may mean bigger resistance on each row/column—and vice-versa—thus asking for thinner traces. For example, the trace width may be 5 or 8 μm.

In an aspect, the projected capacitive touch sensor comprises: a sensor grid including electrically conductive rows 703b and electrically conductive columns 701b, and wherein one or more rows, or one or more columns, include one or more electrically conductive tiles 704b, 702b, wherein each tile 704b, 702b includes multiple electrically connected elements 600a-f with pseudo-random orientation. In an aspect, the height of the tiles 704b, 702b is more than 0.5% of the height of the sensor grid, and/or wherein the width of the tiles 704b, 702b is more than 0.2% of the width of the sensor grid. In an aspect, the one or more electrically connected tiles 704b, 702b are a sequence of tiles, and wherein the sequence of electrically connected tiles is of zig-zag shape. In an aspect, projections of each row 703b or row tile 704b onto the column layer cover gaps or regions between the columns 701b within the column layer, which are not covered by tiles 702b of the columns.

In an aspect, the disorder obtained by pseudo-randomly orienting the elements 600a-f in the tiles 702b, 704b may lead to a reduction in Moiré effect as the substantially ordered display layer (e.g., LCD pixel array) 302 may be superposed (e.g. overlaid) with a substantially disordered effective sensor grid (e.g., row and columns layers) 301.

Figure 7C:
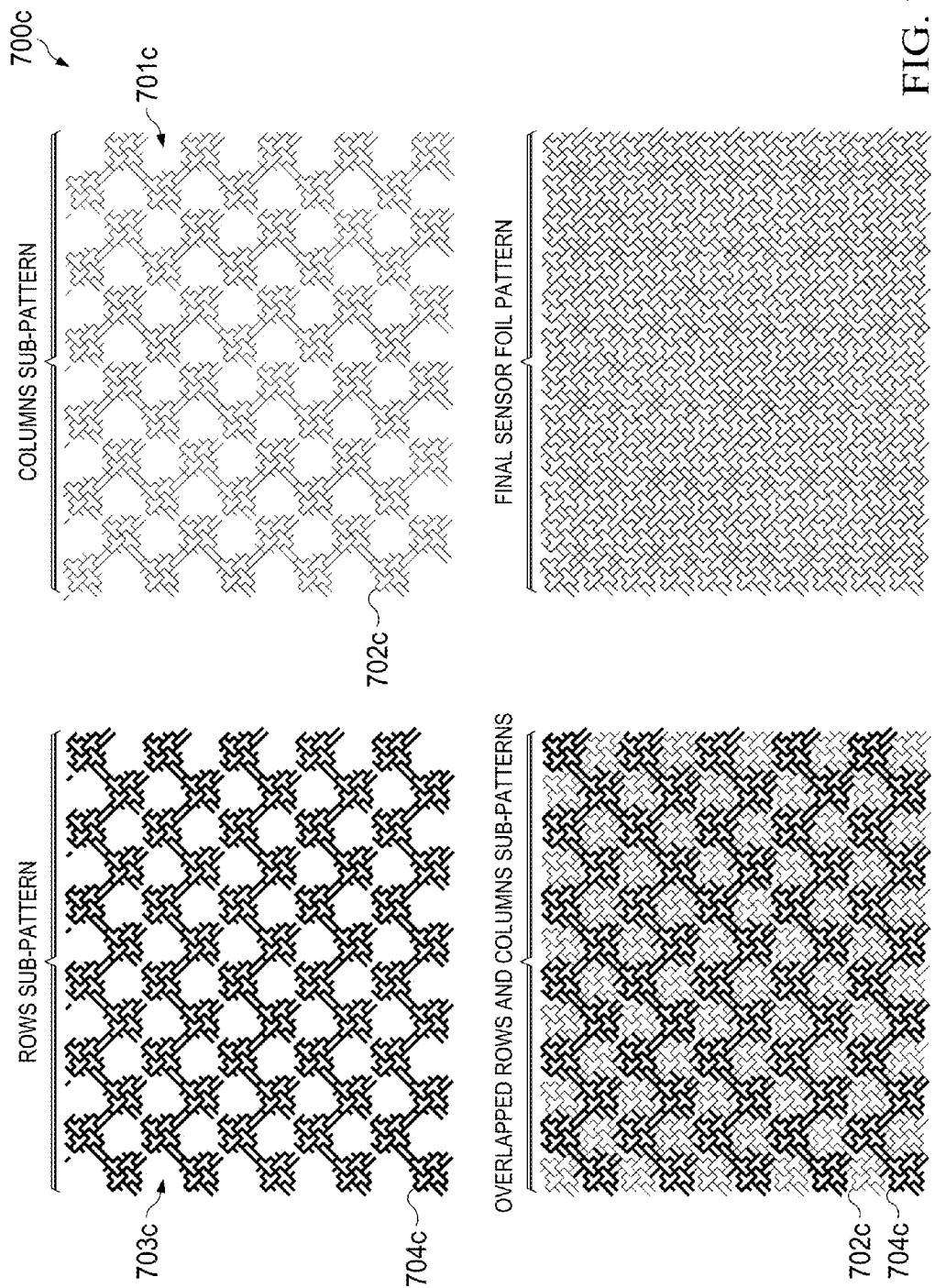
FIG. 7C illustrates a top view of the conductive rows and conductive columns of the sensor grid, wherein the rows and columns are each based on a sequence of tiles composed of pseudo-randomly assembled T-elements.

FIG. 7C illustrates a top view of the conductive rows and conductive columns of the sensor grid. In this embodiment, the sensor grid includes one or more electrically conductive rows and one or more electrically conductive columns, wherein the rows are arranged in a row layer and the columns are arranged in a column layer that is spaced apart from the row layer, one or more of the rows and one or more of the columns including one or more electrically connected tiles, wherein each tile includes multiple electrically connected elements with pseudo-random orientation, and wherein projections of the tiles of the rows onto the column layer at least partially cover regions in the column layer that are not covered by tiles of the columns, preferably wherein projections of the tiles of the columns onto the row layer at least partially cover regions in the row layer that are not covered by tiles of the rows. In this embodiment of FIG. 7C, the rows and columns are each based on a sequence of tiles composed of randomly assembled T-elements or assembled rectangles with subsequently removed edges or boundaries in the post-processing 605. This effective or final sensor pattern (pattern in the bottom row to the right) of the sensor grid 700c may be rendered by the tiles (or their projection onto the column layer) of the row layer filling up the gaps or regions in the column layer and vice versa. This effective or final pattern of the sensor grid 700c may be sliced in a way that parts of it will be the rows sub-pattern and the others the columns sub-pattern. As the previous patterns, each cross arm size may range from 200 μm to 450 μm, e.g. to maintain the overall trace pitch inside the 450 μm down to 150 μm range. The conductive trace width may range from 8 μm down to 1 μm (or less, depending on the sensor size—bigger sensor foil size means bigger resistance on each row/column and vice-versa).

In an aspect, the projected capacitive touch sensor comprises: a sensor grid including electrically conductive rows 703c and electrically conductive columns 701c, and wherein one or more rows, or one or more columns, include one or more electrically conductive tiles 704c, 702c, wherein each tile 704c, 702c includes multiple electrically connected elements 600a-f with pseudo-random orientation. In an aspect, the height of the tiles 704c, 702c is more than 0.5% of the height of the sensor grid, and/or wherein the width of the tiles 704c, 702c is more than 0.2% of the width of the sensor grid. In an aspect, the one or more electrically connected tiles 704b, 702b are a sequence of tiles, and wherein the sequence of electrically connected tiles is of zig-zag shape. In an aspect, projections of each row 703c or row tile 704c onto the column layer cover gaps or regions between the columns 701c within the column layer, which are not covered by tiles 702c of the columns.

In an aspect, the disorder obtained by pseudo-randomly orienting the elements 600a-f in the tiles 702c, 704c may lead to a reduction in Moiré effect as the substantially ordered display layer (e.g., LCD pixel array) 302 may be superposed (e.g. overlaid) with a substantially disordered effective sensor grid (e.g., row and columns layers) 301.

The term "projections", as understood herein, may refer to a mathematic or graphical projection, preferably an orthogonal projection. In case of an orthogonal projection, a connection of a point of the tiles from the rows with the projected image of the point in the column layer may be substantially orthogonal with respect to the column layer (e.g. the principle plane of the column layer). The terms "rows" and "columns" as used herein can be used interchangeably, so that features naming "rows" can also apply to "columns".

FIGS. 8A-B illustrate double-wire configurations and signal flow paths 803, 804, exemplary for the rows 703c and columns 701c of the sensor grid 700c shown in FIG. 7C. Tile zones 801 and bridge zones 802, which electrically connect neighboring tiles of rows or columns, are indicated. In an aspect, the one or more electrically connected tiles 702c or 704c are a sequence of tiles, and wherein neighboring tiles in the sequence are electrically interconnected by two or more electrical wires or traces 802, preferably wherein the width of each of the two or more wires or traces is 0.5 to 10 micrometers, more preferably wherein the width of each of the two or more wires or traces is about 5 micrometers. In addition, one or more boundaries of each of the multiple elements 600a-f include an electrically conductive trace, preferably wherein the width of the trace is 0.5 to 10 micrometers, more preferably wherein the width of the trace is about 5 micrometers. In an aspect, neighboring tiles in the rows 703c and columns 701c are electrically interconnected by two or more electrical wires forming a bridge 802, and wherein projections of the bridges 802 between the tiles of the rows onto the column layer intersect with the bridges between the tiles of the columns under an angle of 80 to 100 degrees, preferably of about 90 degrees. In an aspect, the bridge 802 is aligned under an angle of 30 to 60 degrees, preferably 45 degrees, with respect to pixel rows or pixel columns of a display pixel grid 302 (e.g. LCD) associated with the sensor grid 301.

Thus, the electrical signals 803, 804 may have multiple conductive paths along the elements within each tile 702c, 704c of a row or column to cross the tile 702c, 704c and reach the next, neighboring tile in the respective row or column, e.g. via the conductive bridge 802. This may enhance the reliability of the projected capacitive touch display device 300 in that breaks of conductive traces in the bridge 802 or tile zones 801 may be backed-up by additional traces in the bridge and the tile, respectively. For example if one of the traces or wires in the bridge 802 breaks, the signal 803, 804 may still cross the bridge by the other trace or wire. For example if one of the conductive traces or boundaries in the tile zone 801 (e.g., a conductive trace of an assembled element) breaks, the signal 803, 804 may still cross the tile by another conductive trace of an assembled element. Furthermore, this may reduce the electrical resistance so that dissipation of the row and column signals 803, 804 may be reduced down to a level that allows the projected capacitive touch display device 300 to be scaled beyond 32 inches, e.g. up to 150 inches. In an aspect, the average ohmic resistance in the row and column layer may each be below about 70 to 240 Ohms/mm$^2$, preferably less than that. In an aspect, the average ohmic resistance in the row and column layer may each be below about 120 Ohms/mm$^2$. The resistance of conductive material that is used to create the rows and columns traces should not be too high, as it decreases the electric field created at the interceptions of the rows and columns and also may shift the signal phase considerably. The overall row/column resistance may be dependent on the used conductive material, on the overall trace cross section and on the length of the row/column and supporting traces (like bus lines).

The signal voltage amplitude injected into the rows or columns may influence detection quality. The greater the amplitude of the injected signal, the more contrast may exist between idle received signal and "touched" received signal. This may be helpful to maintain a high signal to noise ratio (SNR) and to maintain stability on touch detection. Moreover, the signal voltage amplitude may be directly related to the electric field range: the bigger amplitude, the bigger the distance the electric field may reach. A direct application of this concept relates to the glass layer 303 thickness (or other sensor support material): the thickest the glass, the strongest the electric field should be to surpass it and be available to be disturbed by the touches. Thus, the signal voltage amplitude may be changed if the sensor support thickness changes. The signal voltage amplitude may range from 12 Volt peak to peak up to 30 Volt peak to peak should give the expected quality on the received signal when using support layers 303 ranging in thickness from 2 mm to 20 mm, respectively. For example, the signal voltage amplitude may range from 5 Volt peak to peak up to 44 Volt peak to peak and may preferably be 12 Volt peak to peak to 24 Volt peak to peak.

As outlined herein, the present disclosure relates to a projected capacitive touch sensor of large sizes, e.g. with a diagonal above 32 inches and preferably up to 150 inches. Specifically, a projected capacitive touch sensor is provided with reduced Moiré effect and reduced electrical signal dissipation. First, optical interferences, such as the Moiré effect, originating from layer stacks in the touch sensor may be significantly reduced (or even substantially suppressed) to allow scaling of projected capacitive touch sensors to the large sensor diagonals. Further, the ohmic resistance and signal dissipation in the electrode layers can be reduced to a regime that allows scaling of projected capacitive touch sensors to the large sensor diagonals thereby providing enhanced reliability for signal propagation along conductive traces within the sensor grid.

The preceding FIGS. and accompanying description illustrate example sensor devices, design methods and manufacturing methods. It will be understood that these devices and methods are for illustration purposes only and that the described or similar techniques may be performed at any appropriate time, including concurrently, individually, or in combination. In addition, many of the steps in these methods may take place simultaneously, concurrently, and/or in different orders than as shown. Moreover, each method may use processes with additional steps, fewer steps, and/or different steps, so long as the methods remain appropriate.

In other words, although this disclosure has been described in terms of certain embodiments and generally associated methods, alterations and permutations of these embodiments and methods will be apparent to those skilled in the art.

What is claimed is:

1. A method of designing a layout for tiles for an electrode of a touch sensor, the method comprising:
generating, by a processing device, the layout for one or more tiles based on multiple regular hexagons that each have three interior traces that have different lengths and converge at a non-centric origin, wherein the generating of the layout of the one or more tiles includes:
rotating, by the processing device, each regular hexagon of a subset of the multiple regular hexagons 60 degrees, 120 degrees, 180 degrees, 240 degrees, or 300 degrees; and
assembling, by the processing device, the rotated regular hexagons and unrotated regular hexagons of the multiple regular hexagons by abutting edges of the rotated regular hexagons and the unrotated regular hexagons.

2. The method of claim 1, wherein at least one of the regular hexagons is congruent to another one of the regular hexagons, and is obtainable from the other one of the regular hexagons by a rotation of above 0 degrees and below or equal 180 degrees, or of above 0 degrees and below or equal 90 degrees, or of about 60 degrees.

3. The method of claim 1, wherein at least one of the regular hexagons is congruent to another one of the regular hexagons, but is not obtainable from the other one of the regular hexagons by a geometric operation not including a rotation or not including a mirroring.

4. The method of claim 1, wherein at least one of the regular hexagons is congruent to another one of the regular hexagons, but is not obtainable from the other one of the regular hexagons by a translation only, or wherein at least one of the regular hexagons is congruent to another one of the regular hexagons, but is obtainable from the other one of the regular hexagons by one or more mirroring operations.

5. The method of claim 1, wherein rotating, by the processing device, the subset of the multiple regular hexagons 60 degrees, 120 degrees, 180 degrees, 240 degrees, or 300 degrees comprises selecting a degree of rotation of each of the multiple regular hexagons using a random generator.

6. The method of claim 1, wherein the one or more tiles are a sequence of tiles, and wherein neighboring tiles in the sequence are electrically interconnected by two or more electrical wires or traces, wherein the width of each of the two or more wires or traces is 0.5 to 10 micrometers, or wherein the width of each of the two or more wires or traces is about 5 micrometers.

7. The method of claim 1, wherein:
the one or more tiles are a sequence of tiles,
each of the multiple regular hexagons of the respective tile in the sequence is configured to conduct a portion of an electrical signal which is received at the respective tile, across the respective tile and to a neighboring tile in the sequence,
one or more boundaries of each of the multiple regular hexagons include an electrically conductive trace, and the width of the trace is 0.5 to 10 micrometers, or the width of the trace is about 5 micrometers.

8. The method of claim 1, wherein:
a diagonal measurement of the touch sensor exceeds 32 inches, and
a longest distance between two points, connected by a straight line, within each regular hexagon is between 100 and 800 micrometers, or between 200 and 700 micrometers, or between 300 and 600 micrometers, or about 450 micrometer long.

9. A system comprising:
one or more computers and one or more storage devices storing instructions that are operable, when executed by the one or more computers, to cause the one or more computers to perform operations comprising:
generating, by a processing device, a layout for one or more tiles based on multiple regular hexagons that each have three interior traces that have different lengths and converge at a non-centric origin, wherein the generating of the layout of the one or more tiles includes:
rotating, by the processing device, each regular hexagon of a subset of the multiple regular hexagons 60 degrees, 120 degrees, 180 degrees, 240 degrees, or 300 degrees; and
assembling, by the processing device, the rotated regular hexagons and unrotated regular hexagons of the multiple regular hexagons by abutting edges of the rotated regular hexagons and the unrotated regular hexagons.

10. The system of claim 9, wherein at least one of the regular hexagons is congruent to another one of the regular hexagons, and is obtainable from the other one of the regular hexagons by a rotation of above 0 degrees and below or equal 180 degrees, or of above 0 degrees and below or equal 90 degrees, or of about 60 degrees.

11. The system of claim 9, wherein at least one of the regular hexagons is congruent to another one of the regular hexagons, but is not obtainable from the other one of the regular hexagons by a geometric operation not including a rotation or not including a mirroring.

12. The system of claim 9, wherein at least one of the regular hexagons is congruent to another one of the regular hexagons, but is not obtainable from the other one of the regular hexagons by a translation only, or wherein at least one of the regular hexagons is congruent to another one of the regular hexagons, but is obtainable from the other one of the regular hexagons by one or more mirroring operations.

13. The system of claim 9, wherein the one or more tiles are a sequence of tiles, and wherein neighboring tiles in the sequence are electrically interconnected by two or more electrical wires or traces, wherein the width of each of the two or more wires or traces is 0.5 to 10 micrometers, or wherein the width of each of the two or more wires or traces is about 5 micrometers.

14. The system of claim 9, wherein:
the one or more tiles are a sequence of tiles,
each of the multiple regular hexagons of the respective tile in the sequence is configured to conduct a portion of an electrical signal which is received at the respective tile, across the respective tile and to a neighboring tile in the sequence,
one or more boundaries of each of the multiple regular hexagons include an electrically conductive trace, and the width of the trace is 0.5 to 10 micrometers, or the width of the trace is about 5 micrometers.

15. The system of claim 9, wherein:
a diagonal measurement of the touch sensor exceeds 32 inches, and
a longest distance between two points, connected by a straight line, within each regular hexagon is between 100 and 800 micrometers, or between 200 and 700 micrometers, or between 300 and 600 micrometers, or about 450 micrometer long.

16. A non-transitory computer-readable medium storing software comprising instructions executable by one or more computers which, upon such execution, cause the one or more computers to perform operations comprising:
generating, by a processing device, the layout for one or more tiles based on multiple regular hexagons that each have three interior traces that have different lengths and converge at a non-centric origin, wherein the generating of the layout of the one or more tiles includes:
rotating, by the processing device, each regular hexagon of a subset of the multiple regular hexagons 60 degrees, 120 degrees, 180 degrees, 240 degrees, or 300 degrees; and
assembling, by the processing device, the rotated regular hexagons and unrotated regular hexagons of the multiple regular hexagons by abutting edges of the rotated regular hexagons and the unrotated regular hexagons.

17. The method of claim 1, wherein assembling the rotated regular hexagons and the unrotated regular hexagons comprises assembling the rotated regular hexagons and the unrotated regular hexagons into a honeycomb-like configuration.

18. The method of claim 1, wherein generating the layout further includes:
removing a portion of the interior traces and edges from the assembled regular hexagons.

19. The method of claim 1, wherein rotating, by the processing device, each regular hexagon of a subset of the multiple regular hexagons 60 degrees, 120 degrees, 180 degrees, 240 degrees, or 300 degrees comprises:
rotating each regular hexagon about a geometric center.

20. The method of claim 1, wherein the subset of the multiple regular comprises a majority of the multiple regular hexagons.

21. The method of claim 1, wherein each edge and each interior trace of each regular hexagon is electrically conductive.

22. The method of claim 1, wherein each of the multiple regular hexagons are identical.

* * * * *